(12) United States Patent
Lien et al.

(10) Patent No.: US 10,880,993 B1
(45) Date of Patent: Dec. 29, 2020

(54) CIRCUIT BOARD HAVING A PREDETERMINED PUNCH AREA AND SHEET SEPARATED FROM THE SAME

(71) Applicant: CHIPBOND TECHNOLOGY CORPORATION, Hsinchu (TW)

(72) Inventors: Yi-Chen Lien, Taichung (TW); Yen-Ping Huang, Kaohsiung (TW); Hui-Yu Huang, Hsinchu (TW); Chih-Ming Peng, Taichung (TW); Chun-Te Lee, Hsinchu County (TW)

(73) Assignee: CHIPBOND TECHNOLOGY CORPORATION, Hsinchu (TW)

( * ) Notice: Subject to any disclaimer, the term of this patent is extended or adjusted under 35 U.S.C. 154(b) by 0 days.

(21) Appl. No.: 16/910,346

(22) Filed: Jun. 24, 2020

(30) Foreign Application Priority Data

Dec. 19, 2019 (TW) .............................. 108146800 A

(51) Int. Cl.
*H05K 1/02* (2006.01)
*H05K 3/00* (2006.01)

(52) U.S. Cl.
CPC ........... *H05K 1/0269* (2013.01); *H05K 3/005* (2013.01); *H05K 2201/09072* (2013.01)

(58) Field of Classification Search
CPC ..... H05K 1/0266–0269; H05K 3/0097; H05K 3/005
See application file for complete search history.

(56) References Cited

FOREIGN PATENT DOCUMENTS

CN          101258026 A       9/2008

OTHER PUBLICATIONS

Taiwanese Office Action dated Sep. 7, 2020 for Taiwanese Patent Application No. 108146800, 3 pages.

*Primary Examiner* — Jeremy C Norris
(74) *Attorney, Agent, or Firm* — Demian K. Jackson; Jackson IPG PLLC

(57) ABSTRACT

A circuit board includes a substrate, a first measurement mark and a second measurement mark, the first and second measurement marks are located on a predetermined punch area of the substrate. After punching, the predetermined punch area is removed such that the circuit board has a through hole and a sheet is separated from the circuit board. By the first and second measurement marks on the sheet, a first distance between a first edge of the sheet and the first measurement mark and a second distance between a second edge of the sheet and the second measurement mark can be measured to determine whether the through hole is shifted or has an incorrect size.

20 Claims, 8 Drawing Sheets

US 10,880,993 B1

CIRCUIT BOARD HAVING A PREDETERMINED PUNCH AREA AND SHEET SEPARATED FROM THE SAME

FIELD OF THE INVENTION

This invention relates to a circuit board, and more particularly to a circuit board having a through hole which is formed by punching and used to expose an electronic component such as fingerprint reader.

BACKGROUND OF THE INVENTION

Because of the trend of multifunctional consumer electronics, conventional circuit board may need a through hole for follow-up manufacturing requirements. The circuit board is usually punched by a cutter to form the through hole, however, the through hole may be shifted or incorrect in size when the cutter is misaligned or blunt or the circuit board is tilted or bended.

SUMMARY

One object of the present invention is to provide measurement marks on a predetermined punch area of a substrate and a circuit board having a through hole and a sheet separated from the circuit board are obtained after punching. By measuring distances between the measurement marks and edges of the sheet, it is able to check whether the through hole is shifted or has a size not in compliance with standards.

A circuit board of the present invention includes a substrate having a predetermined punch area, a first measurement mark and a second measurement mark. The predetermined punch area has a first predetermined punch edge, and a second predetermined punch edge, a through hole is formed on the circuit board and a sheet is separated from the circuit board after removing the predetermined punch area. The through hole is provided for exposing an electronic component. The first measurement mark is disposed on the predetermined punch area, a first measurement position is defined on the first measurement mark and located inside the first predetermined punch edge. A first virtual line passes through the first measurement position and the first predetermined punch edge along a first direction, and the first virtual line and the first predetermined punch edge are intersected at a first intersection point. A first predetermined distance is defined between the first measurement position and the first intersection point and is a shortest distance from the first measurement position to the first predetermined punch edge. The second measurement mark is disposed on the predetermined punch area, a second measurement position is defined on the second measurement mark and located inside the second predetermined punch edge. A second virtual line intersecting with the first virtual line passes through the second measurement position and the second predetermined punch edge along a second direction intersecting with the first direction. The second virtual line and the second predetermined punch edge are intersected at a second intersection point. A second predetermined distance is defined between the second measurement position and the second intersection point and is a shortest distance from the second measurement position to the second predetermined punch edge.

After removing the predetermined punch area of the substrate, a sheet separated from the circuit board is obtained. The sheet includes a body, the first measurement mark and the second measurement mark. The first and second measurement marks are disposed on the body, the first measurement position is located inside a first edge of the sheet and the second measurement position is located inside a second edge of the sheet. The first virtual line passes through the first measurement position and the first edge along the first direction and is intersected with the first edge at a first measurement point. A first distance exists between the first measurement position and the first measurement point and is a shortest distance from the first measurement position to the first edge. The second virtual line passes through the second measurement position and the second edge along the second direction and is intersected with the second edge at a second measurement point. A second distance exists between the second measurement position and the second measurement point and is a shortest distance from the second measurement position to the second edge.

Based on the first and second measurement marks on the substrate, checking the through hole instantly is available by measuring the first distance between the first edge of the sheet and the first measurement mark and measuring the second distance between the second edge of the sheet and the second measurement mark. As a result, abnormal conditions, such as misaligned or blunt punching tool or tilted or bended circuit board, can be eliminated instantly to improve product qualification ratio of the circuit board.

DETAILED DESCRIPTION OF THE INVENTION

Figure 1:
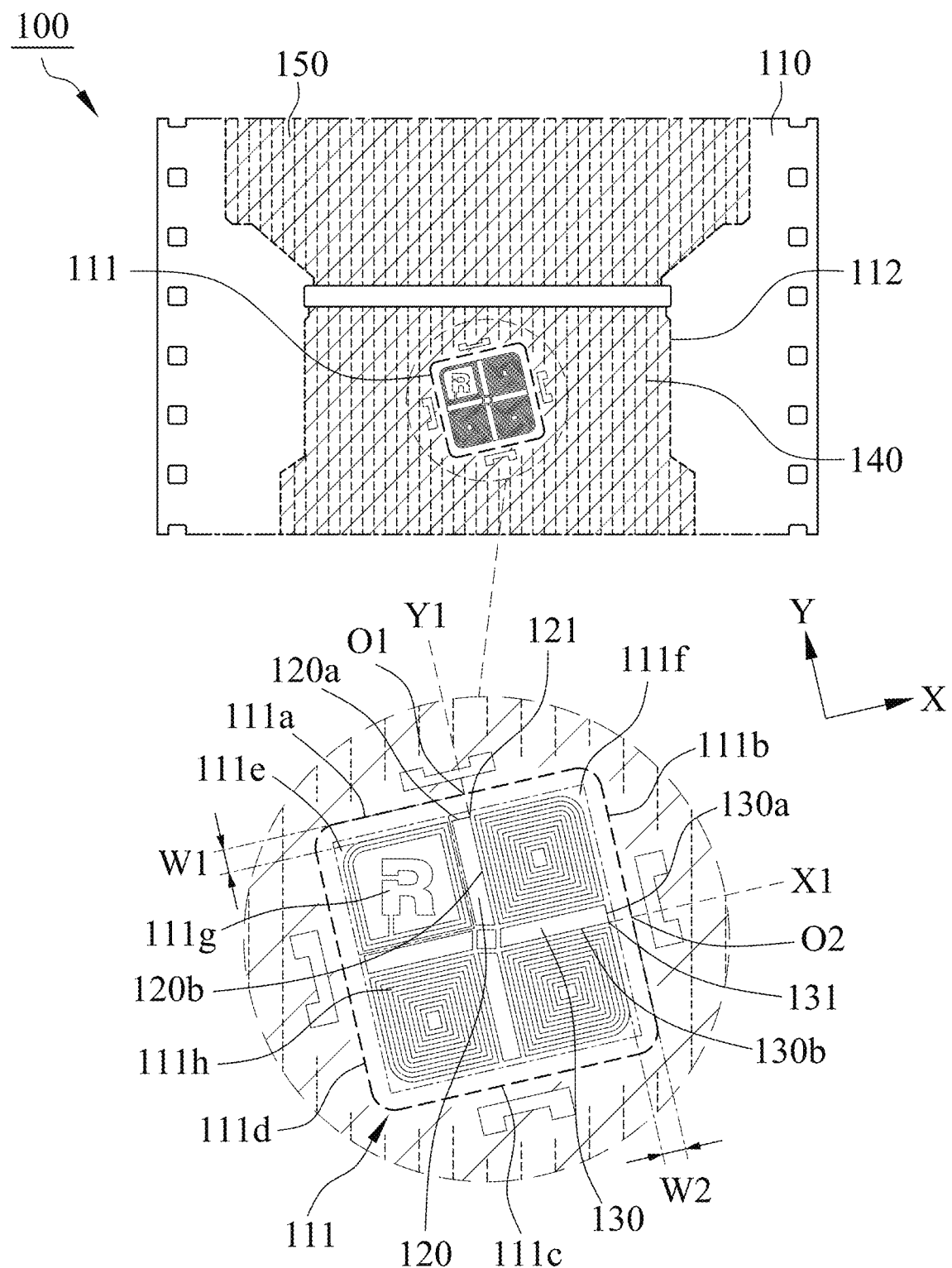
FIG. 1 is a top view diagram illustrating a circuit board in accordance with a first embodiment of the present invention before forming a through hole.
Figure 2:
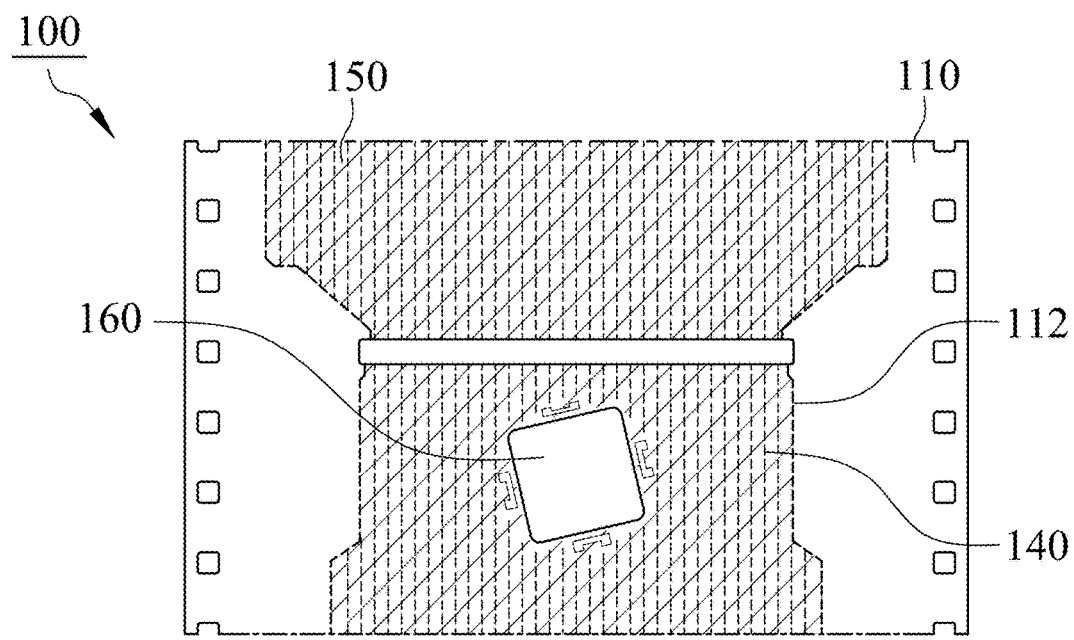
FIG. 2 is a top view diagram illustrating the circuit board in accordance with the first embodiment of the present invention after forming a through hole.
Figure 3:
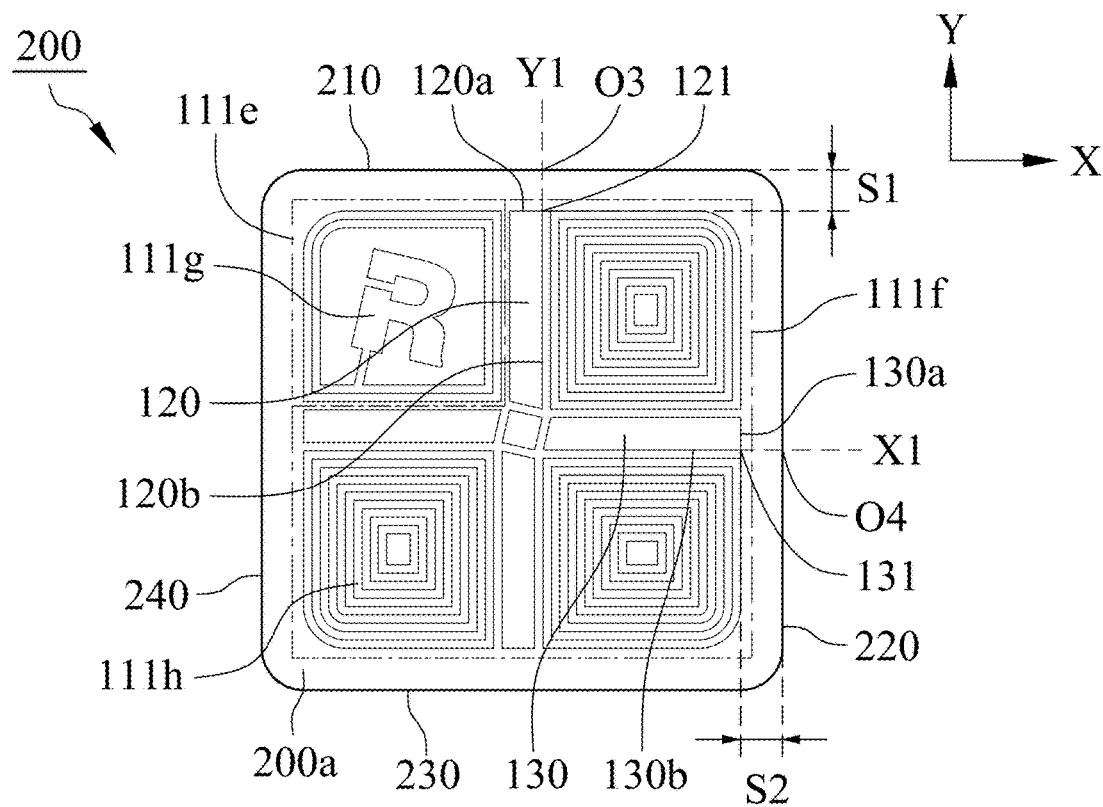
FIG. 3 is a top view diagram illustrating a sheet removed from the circuit board in accordance with the first embodiment of the present invention.

With reference to FIGS. 1 to 3, a circuit board 100 in accordance with a first embodiment of the present invention includes a substrate 110, a first measurement mark 120, a second measurement mark 130 and a circuit layer 140, and preferably, the circuit board 100 further includes a protective insulation layer 150. The substrate 110 is, but not limited to, made of polyimide (PI), and a predetermined punch area 111 and a circuit disposal area 112 are defined on the substrate 110. The circuit layer 140 is disposed on the circuit disposal area 112 and includes a plurality of conductive lines. The first and second measurement marks 120/130 are disposed on the predetermined punch area 111, and in the first embodiment, they are disposed on the same surface of the substrate 110. However, in other embodiments, the first and second measurement marks 120/130 may be disposed on different surfaces of the substrate 110, respectively, and the circuit layer 140 and one of the first and second measurement marks 120/130 are located on the same surface of the substrate 110. Otherwise, the circuit layer 140 may be disposed on two different surfaces of the substrate 110 such that the circuit layer 140 is located on the same surface of the substrate 110 with the first and second measurement marks 120/130, respectively.

With reference to FIG. 2, a punching tool (not shown) is provided to punch the substrate 110 within the predetermined punch area 111. After removing the predetermined punch area 111, the circuit board 100 having a through hole 160 and a sheet 200 separated from the circuit board 100 are obtained. The through hole 160 on the circuit board 100 is provided to expose an electronic component such as fingerprint reader (not shown).

With reference to FIG. 1, the predetermined punch area 111 at least has a first predetermined punch edge 111a and a second predetermined punch edge 111b, and in the first embodiment, the predetermined punch area 111 is a rectangular area and further has a third predetermined punch edge 111c and a fourth predetermined punch edge 111d. The third predetermined punch edge 111c is opposite to the first predetermined punch edge 111a, and the fourth predetermined punch edge 111d is opposite to the second predetermined punch edge 111b. Moreover, the first and second predetermined punch edges 111a/111b are adjacent and connected with each other, the second and third predetermined punch edges 111b/111c are adjacent and connected with each other, the third and fourth predetermined punch edges 111c/111d are adjacent and connected with each other, and the fourth and first predetermined punch edges 111d/111a are adjacent and connected with each other.

With reference to FIG. 1, a first measurement position 121 is defined on the first measurement mark 120. Preferably, the first measurement position 121 is located at a first measurement edge 120a of the first measurement mark 120, and more preferably, the first measurement edge 120a is parallel to the first predetermined punch edge 111a of the predetermined punch area 111 and the first measurement position 121 is located inside the first predetermined punch edge 111a. The first measurement mark 120 of the first embodiment further includes a third measurement edge 120b, and the first and third measurement edges 120a/120b are intersected at the first measurement position 121. Along a first direction Y, a first virtual line Y1 passes through the first measurement position 121 and the first predetermined punch edge 111a, and a first intersection point O1 is defined by the intersection of the first virtual line Y1 and the first predetermined punch edge 111a. A first predetermined distance W1 is defined between the first measurement position 121 and the first intersection point O1 and it is the shortest distance from the first measurement position 121 to the first predetermined punch edge 111a.

With reference to FIG. 1, a second measurement position 131 is defined on the second measurement mark 130. Preferably, the second measurement position 131 is located at a second measurement edge 130a of the second measurement mark 130, and more preferably, the second measurement edge 130a is parallel to the second predetermined punch edge 111b of the predetermined punch area 111 and the second measurement position 131 is located inside the second predetermined punch edge 111b. Along a second direction X intersecting with the first direction Y, a second virtual line X1 passes through the second measurement position 131 and the second predetermined punch edge 111b and intersects with the first virtual line Y1. A second intersection point O2 is defined by the intersection of the second virtual line X1 and the second predetermined punch edge 111b. A second predetermined distance W2 is defined between the second measurement position 131 and the second intersection point O2 and it is the shortest distance from the second measurement position 131 to the second predetermined punch edge 111b.

With reference to FIG. 1, the predetermined punch area 111 involves a first orientation identification area 111e and at least one a second orientation identification area 111f, one of them are used for identifying the orientation of the sheet 200 separated from the circuit board 100. For orientation identification, the first and second orientation identification areas 111e/111f may have different appearances or at least one of them have an identification element. In the first embodiment, there is a first identification element 111g on the first orientation identification area 111e and a second identification element 111h on the second orientation identification area 111f. The first identification element 111g has a shape different to the second identification element 111h. In other embodiments, only one of the first and second orientation identification areas 111e/111h has the identification element.

With reference to FIG. 1, the first and second identification elements 111g/111h in the first embodiment are located on the same surface of the substrate 111, but in other embodiments, the first and second identification elements 111g/111h may be located on different surfaces of the substrate 110, respectively such that the circuit layer 140 and one of the first and second identification elements 111g/111h are located on the same surface of the substrate 110. Furthermore, if the circuit layer 140 is formed on two different surfaces of the substrate 110, it is located on the same surface of the substrate 110 with the first and second identification elements 111g/111h, respectively.

With reference to FIG. 1, one or both of the first and second identification elements 111g/111h are made of a metal material. In the first embodiment, the circuit layer 140 and one or more than one of the first measurement mark 120, the second measurement mark 130, the first identification element 111g and the second identification element 111h are made of the same material. The first measurement mark 120, the second measurement mark 130, the first identification element 111g, the second identification element 111h and the circuit layer 140 may be formed on the predetermined punch area 111 and the circuit disposal area 112, respectively, by casting, lamination, sputtering or plating. In other embodiments, one or more than one of the first measurement mark 120, the second measurement mark 130, the first identification element 111g and the second identification element 111h are made of a insulative material, and preferably, the protective insulation layer 150 used for covering the circuit layer 140 is also made of the same insulative material.

With reference to FIGS. 2 and 3, there are the circuit board 100 having the through hole 160 and the sheet 200 separated from the circuit board 100 after punching. The first and second orientation identification areas 111e/111f are located on the separated sheet 200, and the first measurement mark 120, the second measurement mark 130, the first identification element 111g and the second identification element 111h are also separated from the circuit board 100 with the sheet 200. With reference to FIG. 3, the sheet 200 includes a body 200a and the first and second measurement marks 120/130 located on the body 200a. The sheet 200 has a first edge 210 and a second edge 220, and in the first embodiment, it is rectangular shape and further has a third edge 230 and a fourth edge 240. The third edge 230 is opposite to the first edge 210 and the fourth edge 240 is opposite to the second edge 220. The first and second edges 210/220 are adjacent and connected to each other, the second and third edges 220/230 are adjacent and connected to each other, the third and fourth edges 230/240 are adjacent and connected to each other, and the fourth and first edges 240/210 are adjacent and connected to each other.

With reference to FIG. 3, the first measurement position 121 is located inside the first edge 210 and the second measurement position 131 is located inside the second edge 220. Along the first direction Y, the first virtual lie Y1 passes through the first measurement position 121 and the first edge 210, the first virtual line Y1 and the first edge 210 are intersected at a first measurement point O3. A first distance S1 exists between the first measurement position 121 and the first measurement point O3 and it is the shortest distance from the first measurement position 121 to the first edge 210. Along the second direction X, the second virtual line X1 passes through the second measurement position 131 and the second edge 220, the second virtual line X1 and the second edge 220 are intersected at a second measurement point O4. A second distance S2 exists between the second measurement position 131 and the second measurement point O4 and it is the shortest distance from the second measurement position 131 to the second edge 220.

With reference to FIG. 3, the orientation of the sheet 200 can be identified by the first and second orientation identification areas 111e/111f having different appearances or the first and second identification elements 111g/111h on the first and second orientation identification areas 111e/111f so as to measure the first and second distances S1/S2.

With reference to FIGS. 1 and 3, the absolute difference between the first distance S1 and the first predetermined distance W1 is less than or equal to 0.3 mm (|W1−S1|≤0.3 mm), and the absolute difference between the second distance S2 and the second predetermined distance W2 is less than or equal to 0.3 mm (|W2−S2|≤0.3 mm).

With reference to FIGS. 1 and 3, the position and size of the through hole 160 can be checked by using the measured values of the first and second distances S1/S2 so as to instantly know whether the punch tool is misaligned/blunt or not and whether the circuit board is tilted/bended or not. Consequently, the product qualification ratio of the circuit board 100 can be improved.

Figure 4:
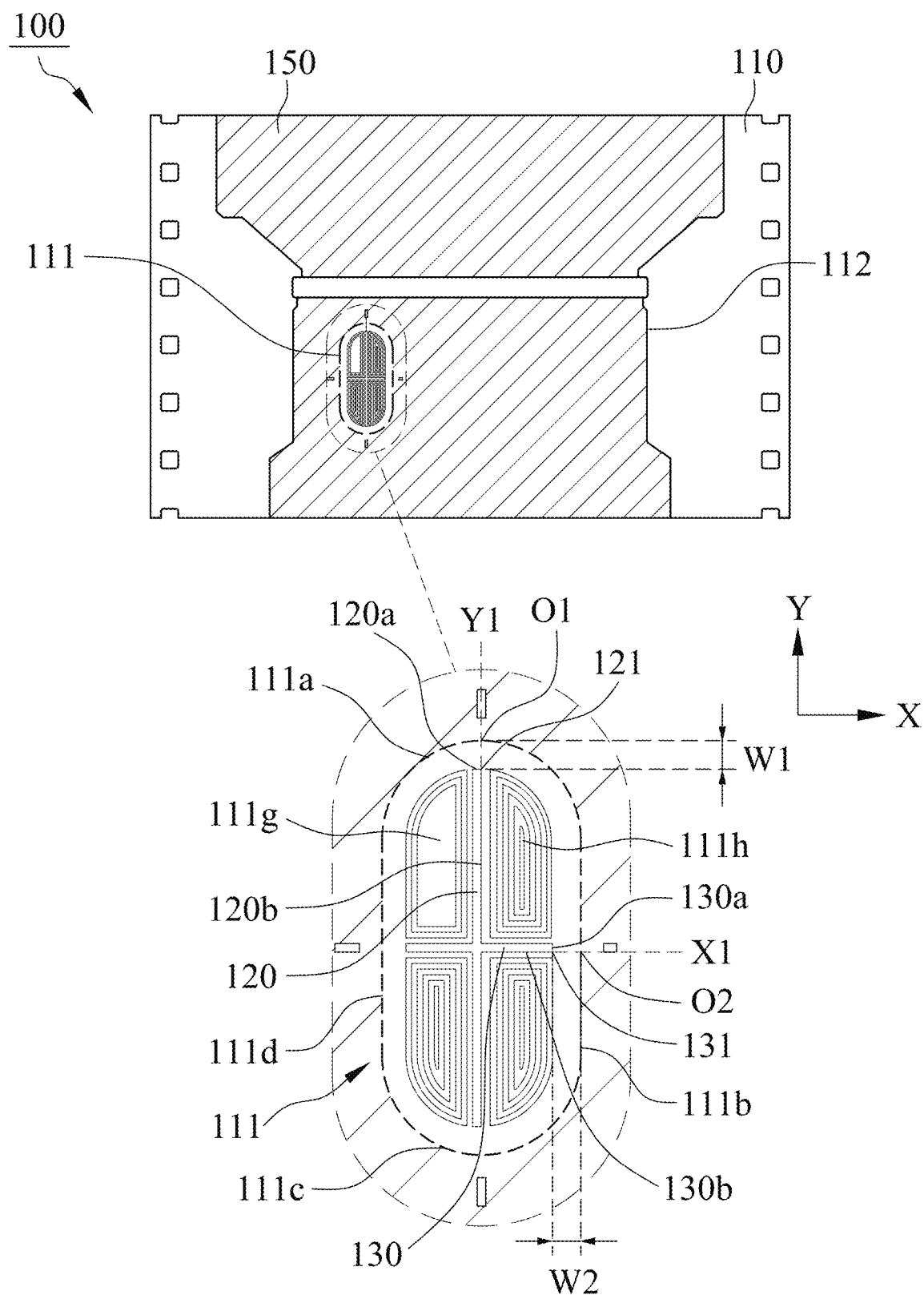
FIG. 4 is a top view diagram illustrating a circuit board in accordance with a second embodiment of the present invention before forming a through hole.
Figure 5:
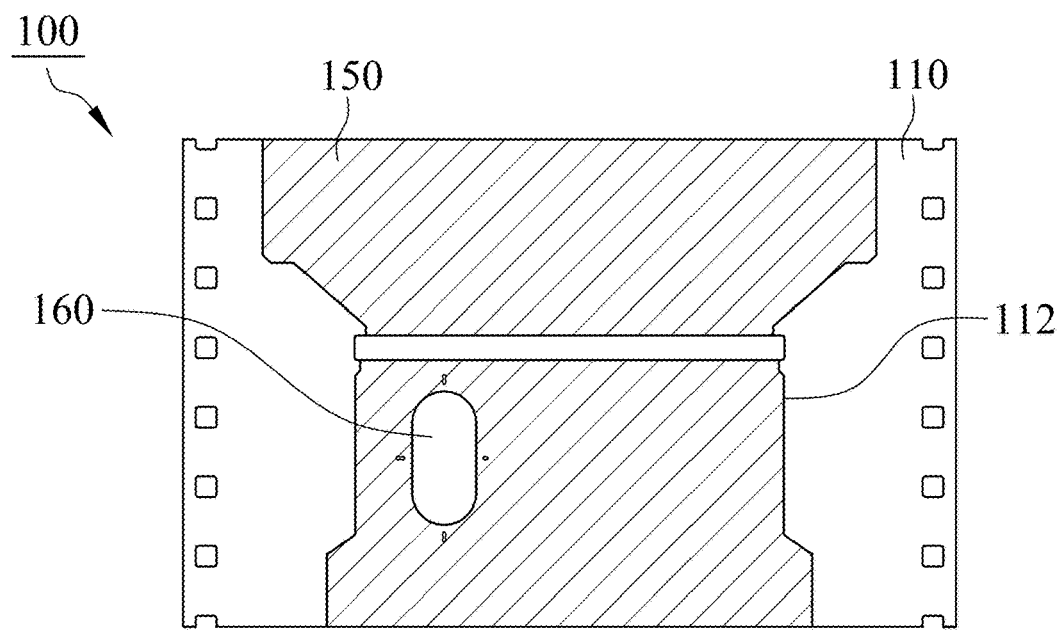
FIG. 5 is a top view diagram illustrating the circuit board in accordance with the second embodiment of the present invention after forming a through hole.
Figure 6:
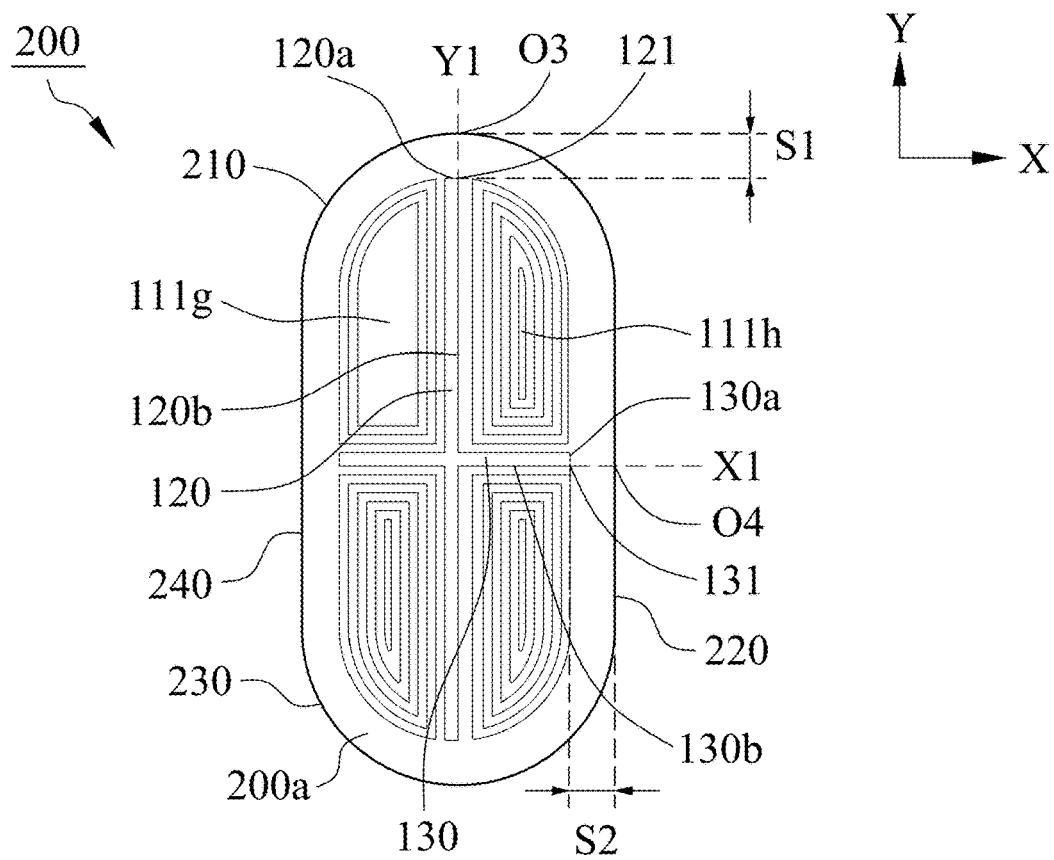
FIG. 6 is a top view diagram illustrating a sheet removed from the circuit board in accordance with the second embodiment of the present invention.
Figure 7:
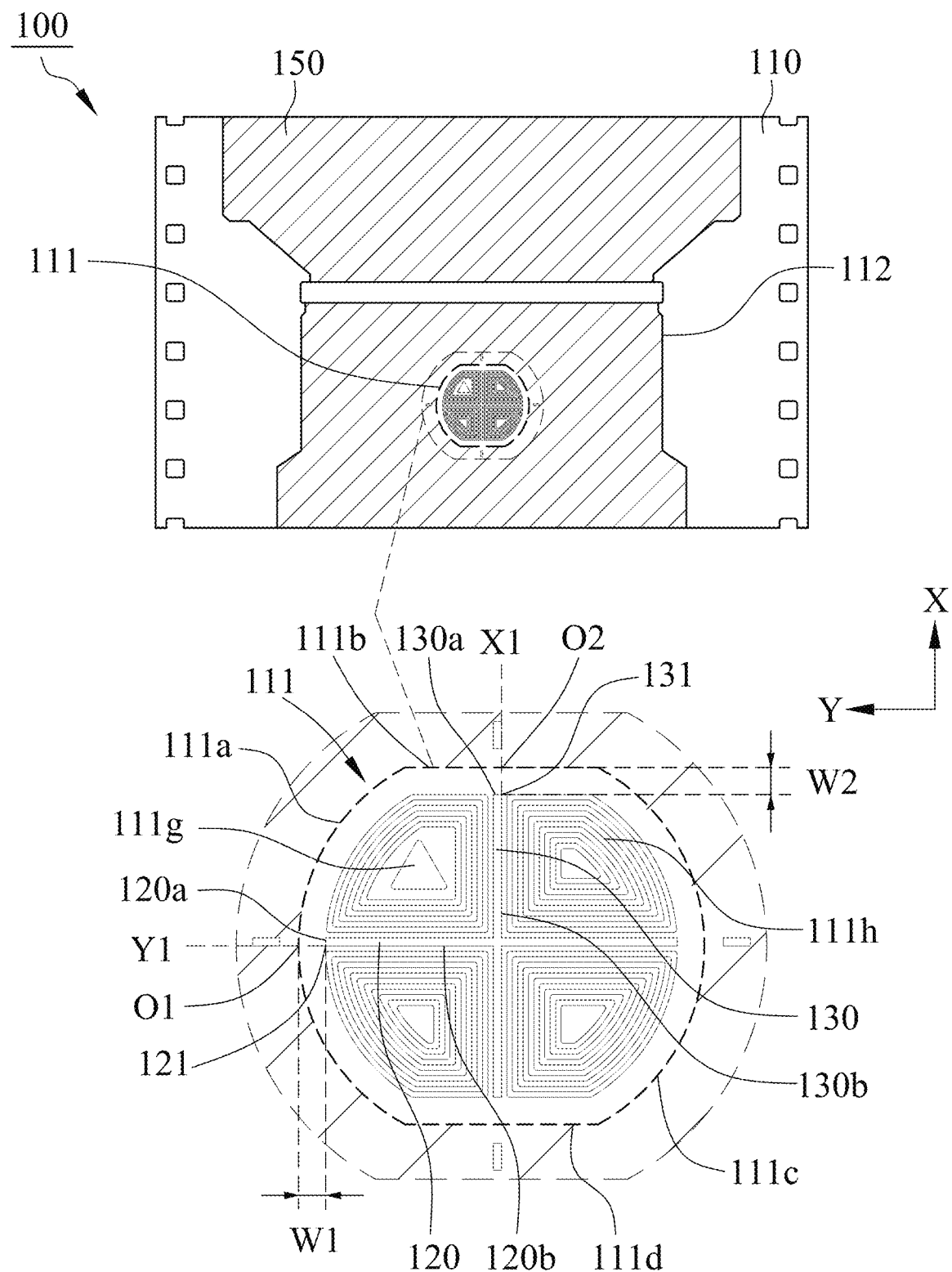
FIG. 7 is a top view diagram illustrating a circuit board in accordance with a third embodiment of the present invention before forming a through hole.
Figure 8:
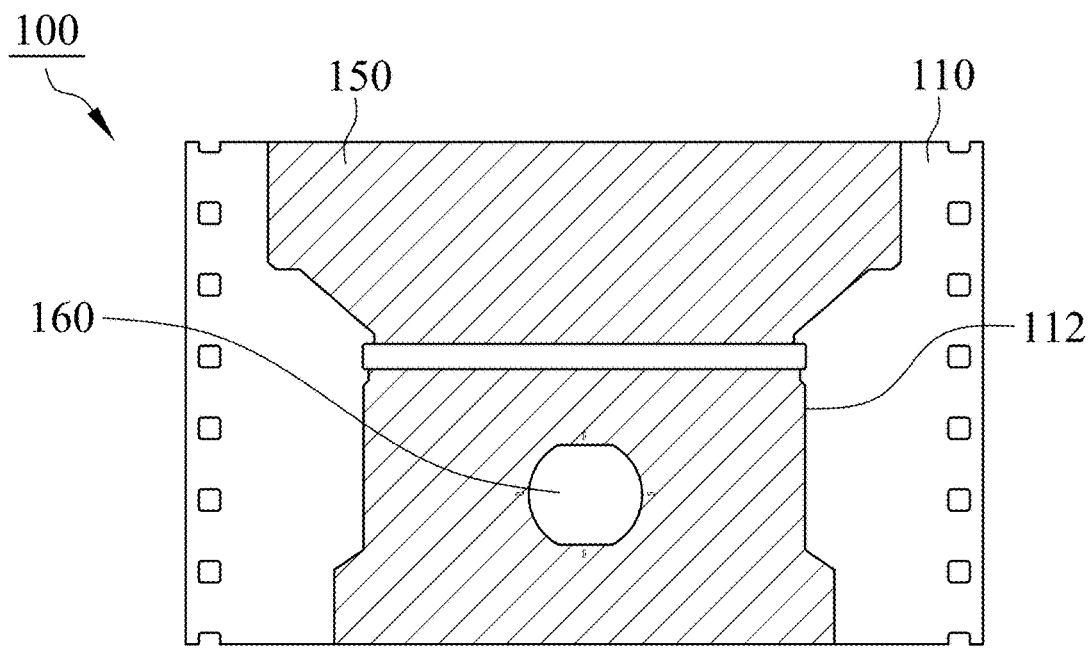
FIG. 8 is a top view diagram illustrating the circuit board in accordance with the third embodiment of the present invention after forming a through hole.

FIGS. 4 to 6 and FIGS. 7 to 9 represent a second embodiment and a third embodiment of the present invention, respectively. With reference to FIGS. 4 and 7, different to the first embodiment, the first predetermined punch edge 111a of the predetermined punch area 111 in the second and third embodiments is an arc edge and the first measurement edge 120a is not parallel to the first predetermined punch edge 111a. In the second and third embodiments, the first virtual line Y1 extends along the third measurement edge 120b and passes through the first intersection point O1 which is the center point of the first predetermined punch edge 111a.

Figure 9:
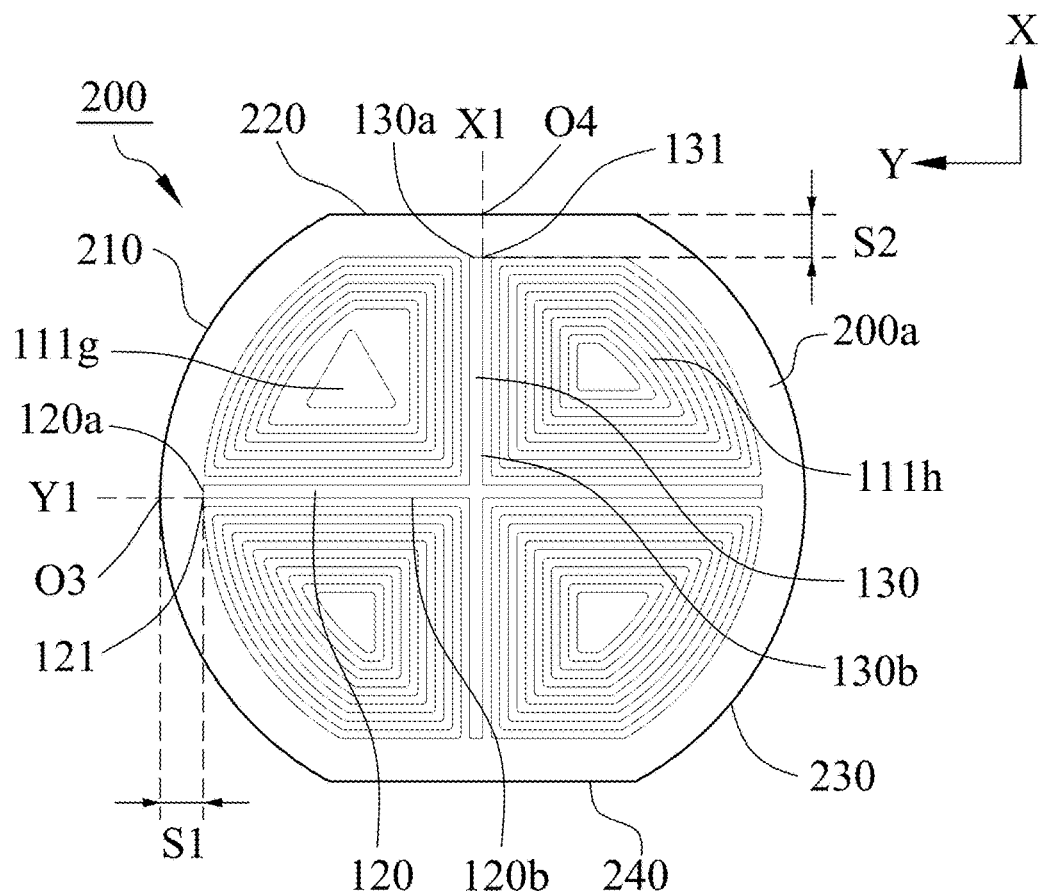
FIG. 9 is a top view diagram illustrating a sheet removed from the circuit board in accordance with the third embodiment of the present invention.

After forming the through hole 160, the first edge 210 of the sheet 200 shown in FIGS. 6 and 9 is an arc edge which is different to the first embodiment. The first virtual line Y1 of the second and third embodiments extends along the third measurement edge 120b and passes through the first measurement portion O3 that is the center point of the first edge 210.

Figure 10:
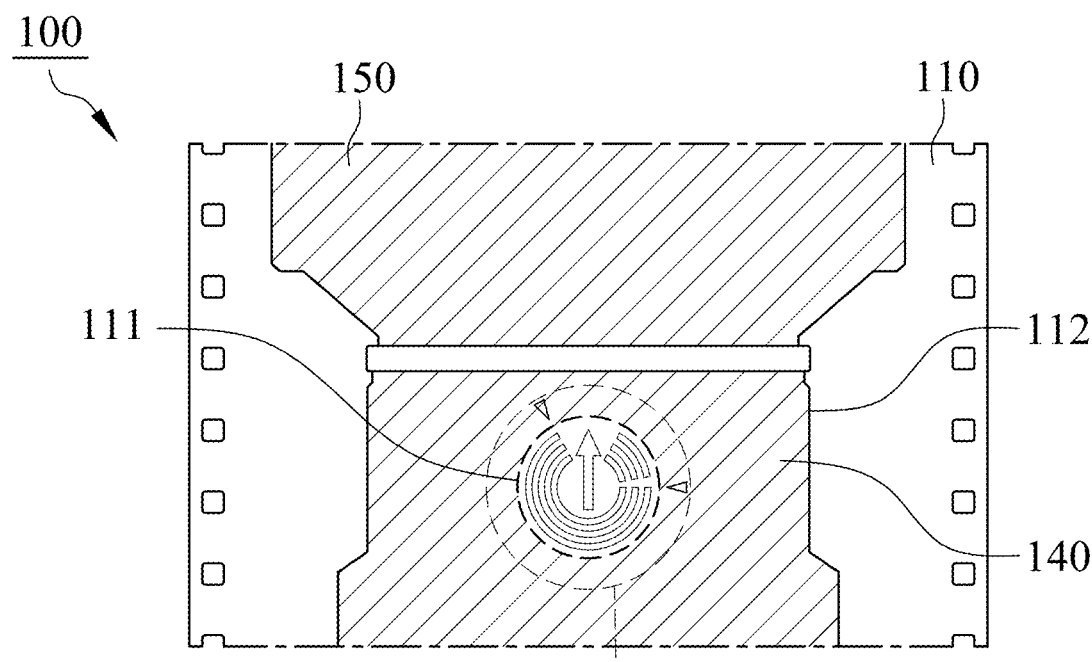
FIG. 10 is a top view diagram illustrating a circuit board in accordance with a fourth embodiment of the present invention before forming a through hole.
Figure 10:
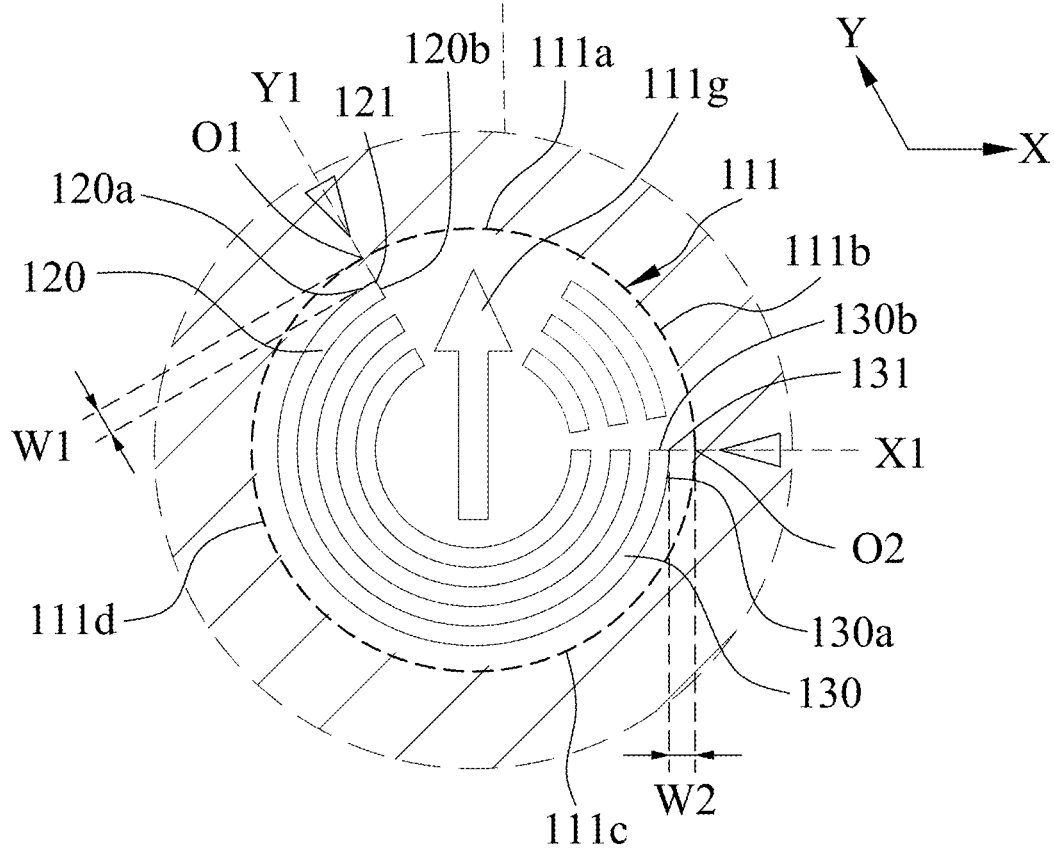
Figure 11:
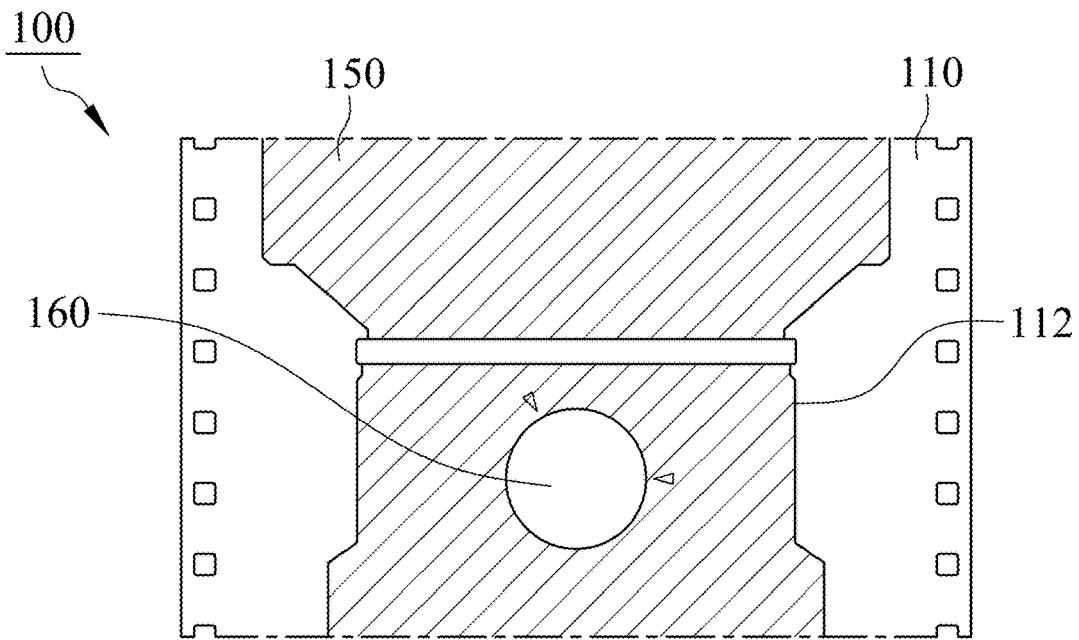
FIG. 11 is a top view diagram illustrating the circuit board in accordance with the fourth embodiment of the present invention after forming a through hole.
Figure 12:
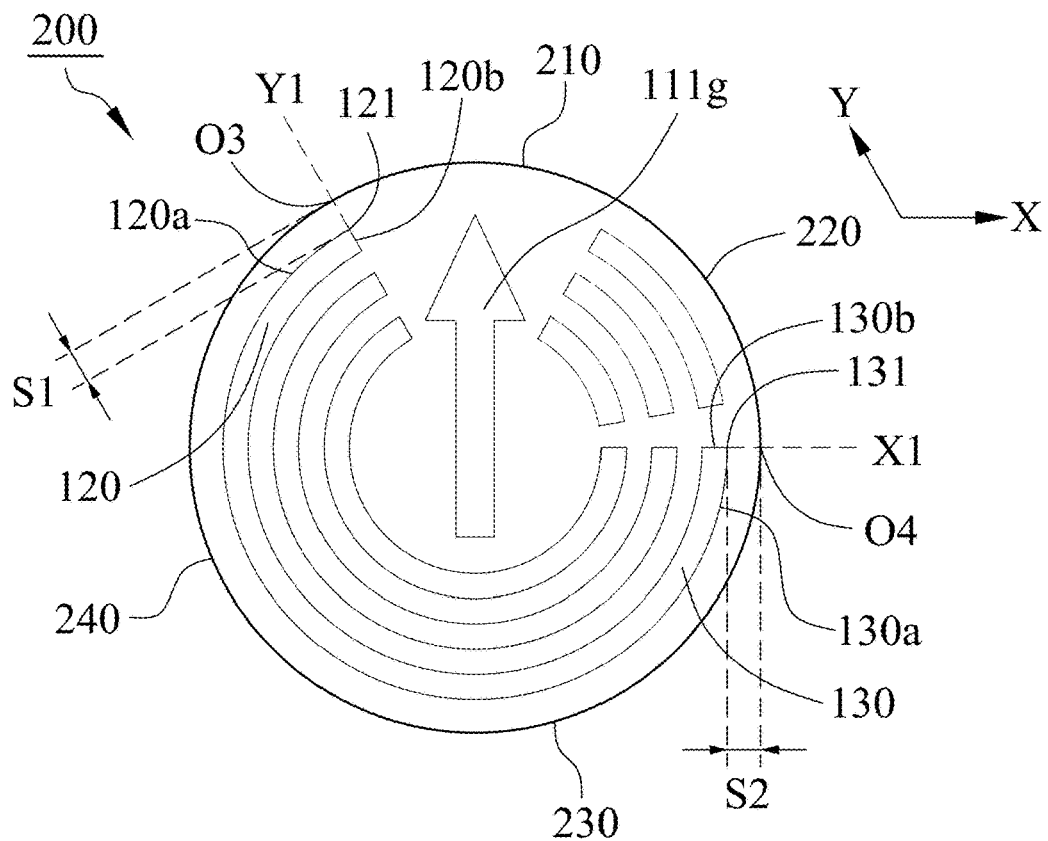
FIG. 12 is a top view diagram illustrating a sheet removed from the circuit board in accordance with the fourth embodiment of the present invention.

A fourth embodiment of the present invention is represented in FIGS. 10 to 12. Before punching, the predetermined punch area 111 of the fourth embodiment is circular that is different to the second and third embodiments. The second measurement mark 130 further has a fourth measurement edge 130b that intersects with the second measurement edges 130a at the second measurement position 131. The second virtual line X1 extends along the fourth measurement edge 130b and passes through the second measurement position 131 and the second measurement point O2. As shown in FIG. 12, the second virtual line X1 on the sheet 200 extends along the fourth measurement edge 130b and passes through the second measurement position 131 and the second measurement point O4.

While this invention has been particularly illustrated and described in detail with respect to the preferred embodiments thereof, it will be clearly understood by those skilled in the art that is not limited to the specific features shown and described and various modified and changed in form and details may be made without departing from the scope of the claims.

What is claimed is:

1. A circuit board, comprising:
 a substrate, a predetermined punch area is defined on the substrate and has a first predetermined punch edge and a second predetermined punch edge, a through hole is formed on the circuit board and a sheet is separated from the circuit board after removing the predetermined punch area, the through hole is provided for exposing an electronic component;
 a first measurement mark disposed on the predetermined punch area, a first measurement position is defined on the first measurement mark and is located inside the first predetermined punch edge, a first virtual line passes through the first measurement position and the first predetermined punch edge along a first direction, the first virtual line and the first predetermined punch edge are intersected at a first intersection point, a first predetermined distance is defined between the first measurement position and the first intersection point and is a shortest distance from the first measurement position to the first predetermined punch edge; and
 a second measurement mark disposed on the predetermined punch area, a second measurement position is defined on the second measurement mark and is located inside the second predetermined punch edge, a second virtual line intersecting with the first virtual line passes through the second measurement position and the second predetermined punch edge along a second direction intersecting with the first direction, the second virtual line and the second predetermined punch edge are intersected at a second intersection point, a second predetermined distance is defined between the second measurement position and the second intersection point and is a shortest distance from the second measurement position to the second predetermined punch edge.

2. The circuit board in accordance with claim 1, wherein the predetermined punch area includes a first orientation identification area and a second orientation identification area, the first or second orientation identification area is provided to identify orientation of the sheet separated from the circuit board for measuring a first distance between the first measurement position and a first edge of the sheet and measuring a second distance between the second measurement position and a second edge of the sheet.

3. The circuit board in accordance with claim 2, wherein a first identification element is disposed on the first orientation identification area, and a second identification element or no identification element is disposed on the second orientation identification area, the first and second identification elements have different appearances.

4. The circuit board in accordance with claim 3 further comprising a circuit layer, wherein the circuit layer and at least one of the first measurement mark, the second measurement mark, the first identification element and the second identification element are made of a same material.

5. The circuit board in accordance with claim 3, wherein the first and second identification elements are disposed on a same surface of the substrate.

6. The circuit board in accordance with claim 3, wherein the first and second identification elements are disposed on different surfaces of the substrate respectively, and a circuit layer and at least one of the first and second identification elements are disposed on a same surface of the substrate.

7. The circuit board in accordance with claim 1, wherein the first measurement position is located at a first measurement edge of the first measurement mark.

8. The circuit board in accordance with claim 7, wherein the first measurement edge is parallel to the first predetermined punch edge of the predetermined punch area.

9. The circuit board in accordance with claim 7, wherein the first measurement mark further has a third measurement edge that intersects with the first measurement edge at the first measurement position.

10. The circuit board in accordance with claim 9, wherein the first virtual line extends along the third measurement edge and passes through the first intersection point, the first predetermined punch edge is an arc edge and the first intersection point is a center point of the arc edge.

11. The circuit board in accordance with claim 1, wherein the first and second measurement marks are disposed on a same surface of the substrate.

12. The circuit board in accordance with claim 1, wherein the first and second measurement marks are disposed on different surfaces of the substrate respectively, and a circuit layer and at least one of the first and second measurement marks are disposed on a same surface of the substrate.

13. A sheet separated from the circuit board in accordance with claim 1, comprising a body, the first measurement mark and the second measurement mark, the first and second measurement marks are located on the body, the first measurement position is located inside a first edge of the sheet and the second measurement position is located inside a second edge of the sheet, the first virtual line passes through the first measurement position and the first edge along the first direction and intersects with the first edge at a first measurement point, a first distance exists between the first measurement position and the first measurement point and is a shortest distance from the first measurement position to the first edge, the second virtual line passes through the second measurement position and the second edge along the second direction and intersects with the second edge at a second measurement point, a second distance exists between the second measurement position and the second measurement point and is a shortest distance from the second measurement position to the second edge.

14. The sheet in accordance with claim 13, wherein a first orientation identification area and a second orientation identification area are defined on the sheet, the first or second orientation identification area is provided to identify orientation of the sheet separated from the circuit board for measuring the first and second distances.

15. The sheet in accordance with claim 14, wherein a first identification element is disposed on the first orientation identification area, and a second identification element or no identification element is disposed on the second orientation identification area, the first and second identification elements have different appearances.

16. The sheet in accordance with claim 13, wherein the first measurement position is located at a first measurement edge of the first measurement mark.

17. The sheet in accordance with claim 16, wherein the first measurement edge is parallel to the first edge of the sheet.

18. The sheet in accordance with claim 16, wherein the first measurement mark further has a third measurement edge that intersects with the first measurement edge at the first measurement position.

19. The sheet in accordance with claim 18, wherein the first virtual line extends along the third measurement edge and passes through the first measurement point, the first edge is an arc edge and the first measurement point is a center point of the arc edge.

20. The sheet in accordance with claim 13, wherein an absolute difference between the first distance and the first predetermined distance is less than or equal to 0.3 mm, and an absolute difference between the second distance and the second predetermined distance is less than or equal to 0.3 mm.

* * * * *